United States Patent
Inoue et al.

(10) Patent No.: US 9,337,325 B2
(45) Date of Patent: *May 10, 2016

(54) SEMICONDUCTOR DEVICE AND METHOD FOR MANUFACTURING THE SAME

(71) Applicant: Renesas Electronics Corporation, Kawasaki-shi (JP)

(72) Inventors: Takashi Inoue, Kawasaki (JP); Tatsuo Nakayama, Kawasaki (JP); Yasuhiro Okamoto, Kawasaki (JP); Hironobu Miyamoto, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/229,645

(22) Filed: Mar. 28, 2014

(65) Prior Publication Data
US 2014/0209980 A1    Jul. 31, 2014

Related U.S. Application Data

(63) Continuation of application No. 13/553,759, filed on Jul. 19, 2012, now Pat. No. 8,716,755.

(30) Foreign Application Priority Data

Sep. 16, 2011 (JP) ................ 2011-202739

(51) Int. Cl.
| | |
|---|---|
| H01L 21/336 | (2006.01) |
| H01L 29/778 | (2006.01) |
| H01L 21/02 | (2006.01) |
| H01L 29/205 | (2006.01) |
| H01L 29/66 | (2006.01) |
| H01L 29/423 | (2006.01) |
| H01L 29/43 | (2006.01) |
| H01L 29/51 | (2006.01) |
| H01L 29/20 | (2006.01) |

(52) U.S. Cl.
CPC .......... *H01L 29/778* (2013.01); *H01L 21/0254* (2013.01); *H01L 21/02458* (2013.01);
(Continued)

(58) Field of Classification Search
CPC ............... H01L 21/02458; H01L 21/0254; H01L 29/778
USPC ................. 438/285; 257/76, 194
See application file for complete search history.

(56) References Cited

U.S. PATENT DOCUMENTS

| 8,618,578 B2 | 12/2013 | Ota et al. |
| 2001/0020700 A1 | 9/2001 | Inoue et al. |

(Continued)

FOREIGN PATENT DOCUMENTS

| JP | 2006-032524 A | 2/2006 |
| JP | 2006-228786 A | 8/2006 |

(Continued)

OTHER PUBLICATIONS

Notice of Allowance dated Dec. 20, 2013, in U.S. Appl. No. 13/553,759.

(Continued)

*Primary Examiner* — Long K Tran
(74) *Attorney, Agent, or Firm* — McGinn IP Law Group, PLLC

(57) ABSTRACT method for manufacturing a semiconductor device includes forming a buffer layer made of a nitride semiconductor, forming a channel layer made of a nitride semiconductor over the buffer layer, forming a barrier layer made of a nitride semiconductor over the channel layer, forming a cap layer made of a nitride semiconductor over the barrier layer, forming a gate insulating film so as to in contact with the cap layer; and forming a gate electrode over the gate insulating film, wherein compression strains are generated at an interface between the cap layer and the barrier layer and an interface between the channel layer and the buffer layer and a tensile strain is generated at an interface between the barrier layer and the channel layer by controlling compositions of the cap layer, the barrier layer, the channel layer, and the buffer layer.

3 Claims, 15 Drawing Sheets

(52) U.S. Cl.
CPC ........ *H01L29/205* (2013.01); *H01L 29/66431* (2013.01); *H01L 29/66462* (2013.01); *H01L 29/7783* (2013.01); *H01L 29/2003* (2013.01); *H01L 29/4236* (2013.01); *H01L 29/432* (2013.01); *H01L 29/517* (2013.01)

(56) References Cited

U.S. PATENT DOCUMENTS

| | | | | |
|---|---|---|---|---|
| 2004/0227154 | A1* | 11/2004 | Chu et al. | 257/194 |
| 2010/0264461 | A1* | 10/2010 | Rajan et al. | 257/194 |
| 2011/0140172 | A1 | 6/2011 | Chu et al. | |

FOREIGN PATENT DOCUMENTS

| | | |
|---|---|---|
| JP | 2008-140813 A | 6/2008 |
| JP | 2008-305816 A | 12/2008 |
| WO | WO 2010/064706 A1 | 6/2010 |
| WO | WO 2010/092768 A1 | 8/2010 |

OTHER PUBLICATIONS

Japanese Office Action dated Feb. 24, 2015 with an English translation thereof.
Japanese Office Action dated Jan. 5, 2016 with an English translation.

* cited by examiner

SEMICONDUCTOR DEVICE AND METHOD FOR MANUFACTURING THE SAME

CROSS-REFERENCE TO RELATED APPLICATIONS

The present application is a Continuation Application of U.S. patent application Ser. No. 13/553,759 filed on Jul. 19, 2012, which is based on and claims priority from Japanese Patent Application No. 2011-202739, filed on Sep. 16, 2011, the entire contents of which is incorporated herein by reference.

BACKGROUND

The present invention relates to a semiconductor device having a field-effect transistor using a nitride semiconductor layer and a method for manufacturing the same.

Field-effect transistors using a nitride semiconductor layer made of GaN and the like have characteristics of high withstand voltage and low resistance, so that the transistors are expected to be used for elements for electric power control.

Patent document 1 describes that, over a channel layer made of GaN, an electron supply layer made of AlGaN is formed, and a gate insulating film made of MN and a cap layer are further stacked over the electron supply layer in this order. The cap layer is made of a material having the same lattice parameter or thermal expansion coefficient as a barrier layer or the electron supply layer.

Patent Document 1

Japanese Patent Application Publication No. 2008-140813

SUMMARY

Low on-resistance and high threshold voltage are required for a transistor for the electric power control. However, a transistor using a nitride semiconductor layer as a channel is difficult to satisfy both characteristics.

Among means for solving the problem disclosed in the present application, outlines of the representative means are briefly described as follows. A semiconductor device according to one embodiment includes a buffer layer made of a nitride semiconductor; a channel layer formed over the buffer layer and made of a nitride semiconductor; and a barrier layer formed over the channel layer and made of a nitride semiconductor. Compression strains are generated at an interface between the cap layer and the barrier layer and an interface between the channel layer and the buffer layer, and a tensile strain is generated at an interface between the barrier layer and the channel layer. The channel layer has a three-layer stacked layer structure having a first layer, a second layer, and a third layer. The second layer has a higher electron affinity than those of the first layer and the second layer.

The semiconductor device according to another aspect includes a buffer layer made of a nitride layer; a channel layer formed over the buffer layer and made of a nitride semiconductor; a barrier layer formed over the channel layer and made of a nitride semiconductor; and a cap layer formed over the barrier layer and made of a nitride semiconductor. The cap layer, the barrier layer, the channel layer, and the buffer layer are polarized. Negative charge is higher than positive charge at the interface between the cap layer and the barrier layer and the interface between the channel layer and the buffer layer, while positive charge is higher than negative charge at the interface between the barrier layer and the channel layer. The channel layer has a three-layer stacked layer structure having a first layer, a second layer, and a third layer. The second layer has a higher electron affinity than those of the first layer and the second layer.

A method for manufacturing a semiconductor device according to another aspect includes the steps of: forming a buffer layer made of $Al_xGa_{1-x}N$; forming a channel layer having a stacked layer structure stacking a GaN layer, an $In_yGa_{1-y}N$ layer (here x<y), and a GaN layer in this order over the buffer layer; forming a barrier layer made of $Al_zGa_{1-z}N$ (here x<z) over the channel layer; and forming a cap layer made of GaN over the barrier layer.

According to the present invention, high threshold voltage with low on-resistance can be achieved by the transistor using the nitride semiconductor layer as the channel.

DETAILED DESCRIPTION

Hereinafter, embodiments of the present invention are described using the drawings. In all the drawings, a similar numerical sign is assigned to a similar configuration element and description thereof is arbitrarily omitted.

First Embodiment

Figure 1:
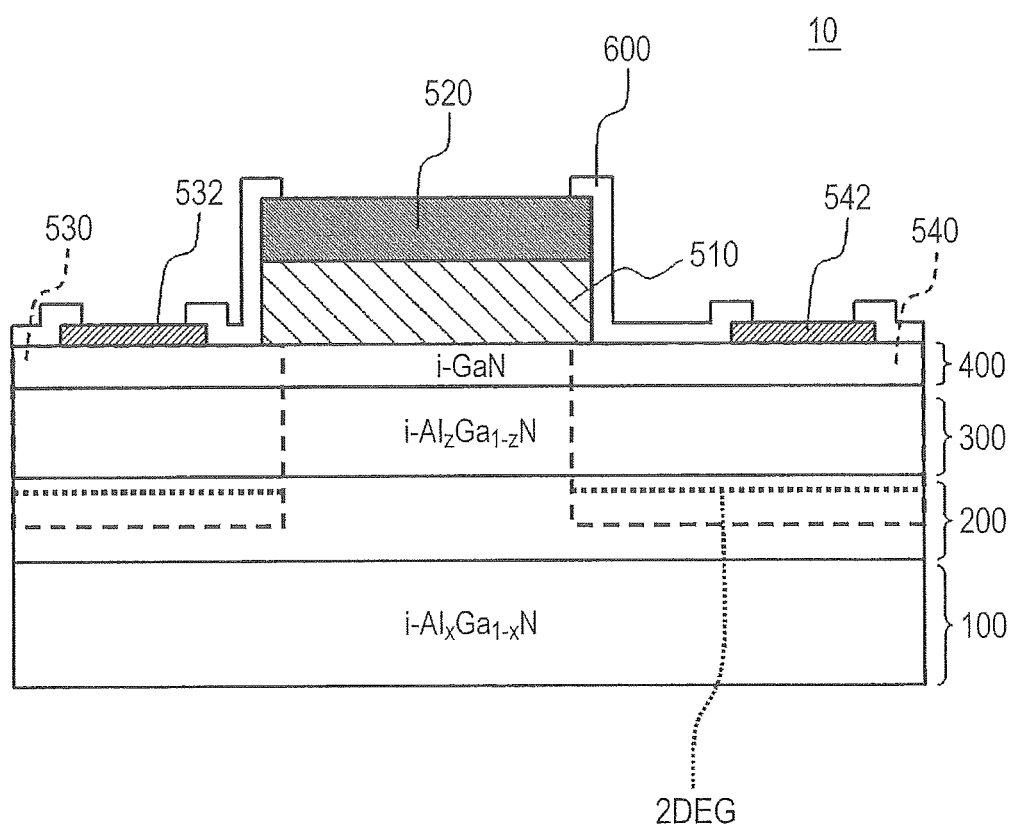
FIG. 1 is a cross-sectional view illustrating a configuration of a semiconductor device according to a first embodiment.

FIG. 1 is a cross-sectional view illustrating a configuration of a semiconductor device according to the first embodiment. The semiconductor device includes a field-effect transistor 10. The field-effect transistor 10 includes a buffer layer 100, a channel layer 200, a barrier layer 300, a cap layer 400, a gate insulating film 510 and a gate electrode 520. The gate insulating film 510 is formed of, for example, $Al_2O_3$, $SiO_2$, $Si_3N_4$, $HfO_2$, $ZrO_2$, $Y_2O_3$, $La_2O_3$, $Ta_2O_5$, $TiO_2$ and the like. The gate electrode 520 is formed of, for example, materials such as polysilicon and TiN; metals such as W and Mo, or silicides such as NiSi and WSi. Any of the buffer layer 100, the channel layer 200, the barrier layer 300, and the cap layer 400 are nitride semiconductor layers. The gate insulating film 510 is Ruined so as to be in contact with the cap layer 400. The gate electrode 520 is formed over the gate insulating film 510. In this embodiment, the gate insulating film 510 is formed over the cap layer 400.

The buffer layer 100 is grown over an Si substrate (not illustrated) in a Ga-face growth mode in parallel with the (0001) crystal axis. The channel layer 200 is epitaxially grown over the buffer layer 100. A composition of the channel layer 200 is different from a composition of the buffer layer 100. Consequently, a lattice parameter of the channel layer 200 is different from a lattice parameter of buffer layer 100. A compression strain is generated at an interface between the channel layer 200 and the buffer layer 100. Each layer is polarized because both of the channel layer 200 and the buffer layer 100 are nitride semiconductor layers. These two layers have different polarization intensity. The channel layer 200 and the buffer layer 100 are polarized in a direction in which negative charge is higher than positive charge at the interface of these layers.

The barrier layer 300 is epitaxially grown over the channel layer 200. A composition of the barrier layer 300 is different from the composition of the channel layer 200. Consequently, a lattice parameter of the barrier layer 300 is different from the lattice parameter of channel layer 200. A compression strain is generated at an interface of the barrier layer 300 and the channel layer 200. Polarization is generated because the barrier layer 300 is also a nitride semiconductor layer. The barrier layer 300 has different polarization intensity from the channel layer 200. The barrier layer 300 is polarized in a direction in which positive charge is higher than negative charge at the interface between the barrier layer 300 and the channel layer 200.

The cap layer 400 is epitaxially grown over the barrier layer 300. A composition of the cap layer 400 is different from the composition of the barrier layer 300. Consequently, a lattice parameter of the cap layer 400 is different from the lattice parameter of barrier layer 300. A compression strain is generated at an interface of the cap layer 400 and the barrier layer 300. Polarization is generated because the cap layer 400 is also a nitride semiconductor layer. The cap layer 400 has different polarization intensity from the barrier layer 300. The cap layer 400 is polarized in a direction in which negative charge is higher than positive charge at the interface between the cap layer 400 and the barrier layer 300.

In this embodiment, the buffer layer 100 is made of i-type $Al_xGa_{1-x}N$. The channel layer 200 has a stacked layer structure including a plurality of layers containing i-type GaN layers. The barrier layer 300 is made of i-type $Al_zGa_{1-z}N$. The cap layer 400 is made of an i-type GaN layer. Here, x<z.

In this embodiment, the field-effect transistor 10 has a first impurity layer 530 and a second impurity layer 540. The first impurity layer 530 is a source of the field-effect transistor 10 and the second impurity layer 540 is a drain of the field-effect transistor 10. Both of the first impurity layer 530 and the second impurity layer 540 are formed in the cap layer 400, the barrier layer 300, and the upper part of the channel layer 200. The first impurity layer 530 and the second impurity layer 540 are, for example, formed by ion implantation of impurities. For example, when the field-effect transistor 10 is an n-type transistor, an impurity which the first impurity layer 530 and the second impurity layer 540 have is Si and when the field-effect transistor 10 is a p-type transistor, an impurity which the first impurity layer 530 and the second impurity layer 540 have is Mg.

Over a region of the cap layer 400 where the first impurity layer 530 is formed, a source electrode 532 is formed, and over a region of the cap layer 400 where the second impurity layer 540 is formed, a drain electrode 542 is formed.

In the interface between the barrier layer 300 and the channel layer 200, 2-dimensional electron gas (2DEG) is formed in a region where the first impurity layer 530 is formed and the region where the second impurity layer 540 is formed. However, in the interface, 2DEG is not formed in a part positioned under the gate insulating film 510. Consequently, the field-effect transistor 10 is a normally-off type transistor. When voltage exceeding a threshold value is applied to the gate electrode 520, 2DEG is formed in the part positioned under the gate insulating film 510 in the interface between the barrier layer 300 and the channel layer 200. Thereby, the field-effect transistor 10 turns on.

Regions which are not covered with the gate electrode 520, the source electrode 532, or the drain electrode 542 in the cap layer 400 are covered with a protective insulating film 600. The protective insulating film 600 is, for example, an SiN film. The protective insulating film 600 also covers edges of the gate electrode 520, the source electrode 532 and the drain electrode 542.

Figure 2:
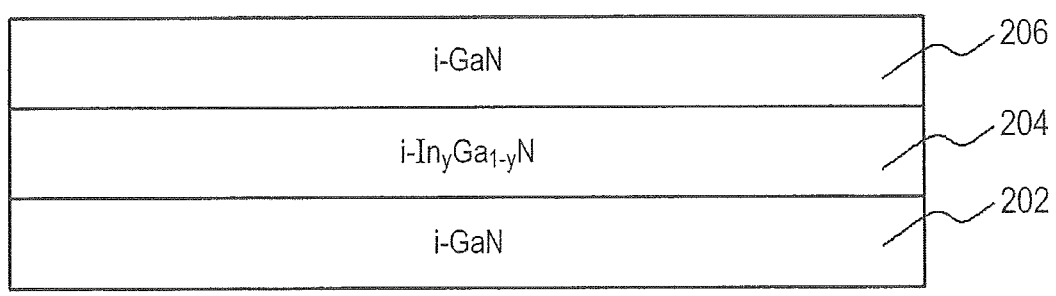
FIG. 2 is a cross-sectional view illustrating a configuration of a channel layer.

FIG. 2 is a cross-sectional view illustrating configuration of the channel layer 200. The channel layer 200 has a stacked layer structure made of at least a first layer 202, a second layer 204, and a third layer 206. In other words, the channel layer 200 has a double hetero structure. The second layer 204 has a higher electron affinity than those of the first layer 202 and the third layer 206. In this embodiment, the first layer 202 and the third layer 206 are i-type GaN layers and the second layer 204 is an $In_yGa_{1-y}N$ layer. Here, x<y. A thickness of the first layer 202 is, for example, 2 nm or more and 20 nm or less; a thickness of the second layer 204 is, for example, 2 nm or more and 20 nm or less; and a thickness of the third layer 206 is, for example, 2 nm or more and 20 nm or less. When the first layer 202 does not exist, the effect of the present invention can be obtained.

In the channel layer 200, a region having a high electron affinity may be formed away from the barrier layer 300 compared with a region where the channel layer 200 is in contact with the barrier layer 300. Consequently, for example, the channel layer 200 may be formed by an In composition gradient material layer of InGaN, and an In composition ratio is gradually reduced from the buffer layer 100 side to the barrier layer 300.

The third layer 206 can be made of materials other than i-GaN, for example, p-type impurity doped P-GaN. When the p-type impurity is doped, negative space charge is formed. As a result, a conduction band of the third layer 206 is raised and electrons in the channel layer 200 tend to gather from the third layer 206 to the second layer 204. From this reason, the channel layer 200 may have a structure in which layers of i-GaN and p-GaN are sequentially stacked from the buffer layer 100 side.

Figure 3:
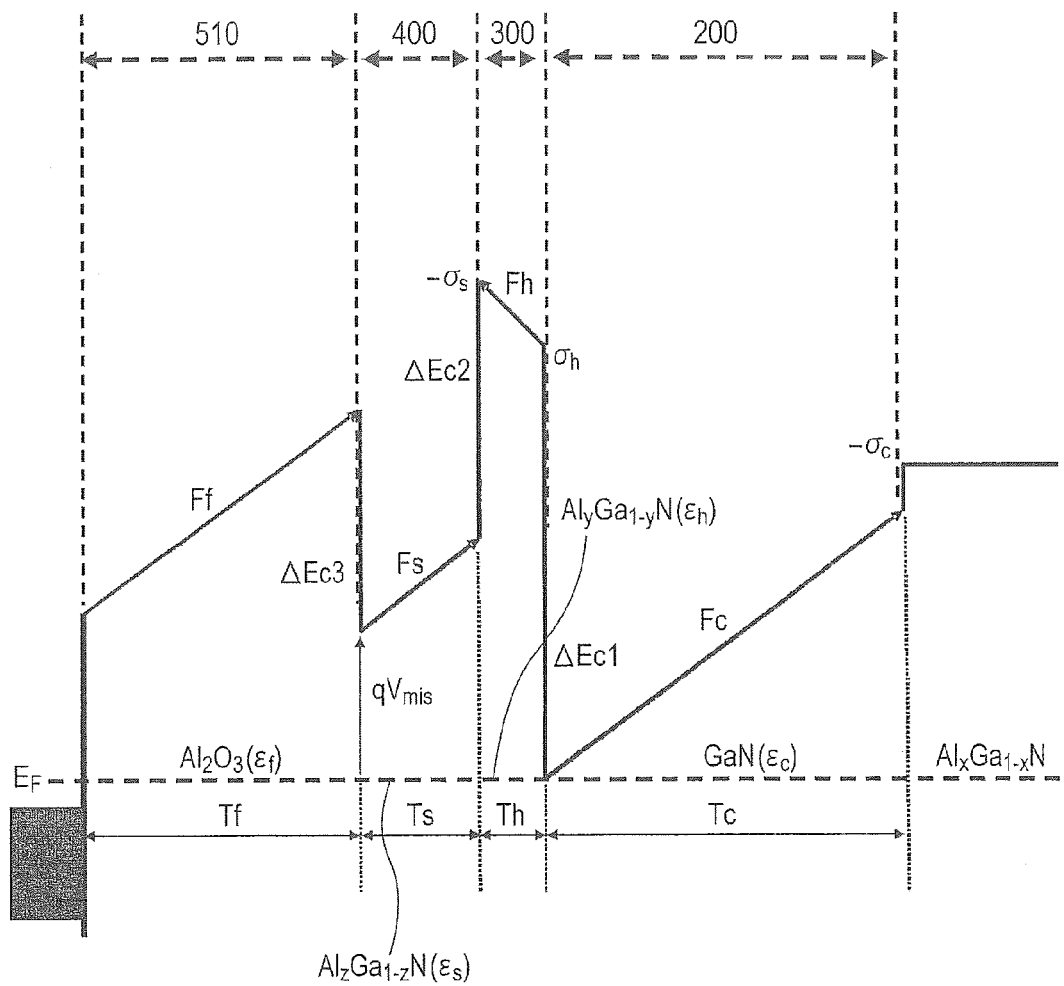
FIG. 3 is a chart illustrating potential of conduction band in each layer configuring the field-effect transistor illustrated in FIG. 1.

FIG. 3 is a chart illustrating potential of conduction bands in each layer configuring the field-effect transistor 10 illustrated in FIG. 1. In this chart, the channel layer 200 is determined as a single layer structure made of GaN for description.

Figure 10:
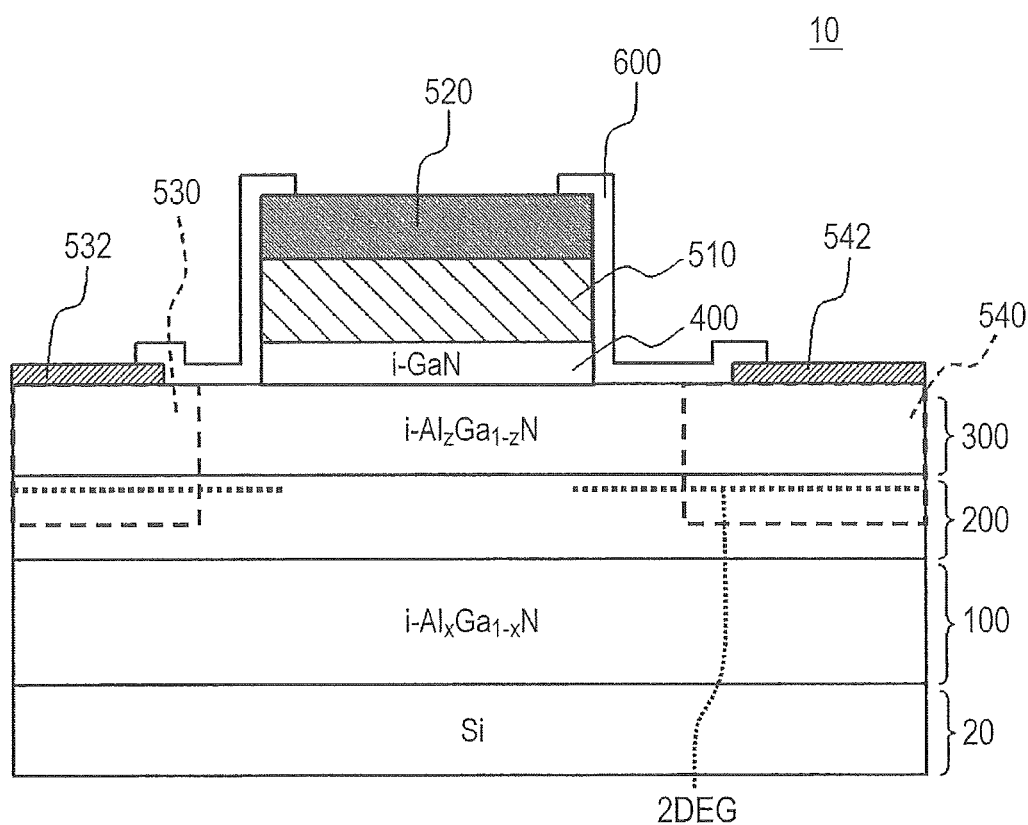
FIG. 10 is a cross-sectional view illustrating a configuration of a field-effect transistor according to a second embodiment.

The field-effect transistor 10 illustrated in FIG. 10 can be operated as an MOS transistor. The field-effect transistor 10 being operated as the MOS transistor has high on-resistance compared with the field-effect transistor 10 being operated by using 2DEG. In order to prevent the field-effect transistor 10 from being operated as the MOS transistor, as illustrated in FIG. 3, potential $q^V_{mis}$ of the cap layer 400 at an interface between the gate insulating film 510 and the cap layer 400 is required to be higher than potential $E_F$ at the interface between the barrier layer 300 and the channel layer 200. As the cap layer 400 becomes thicker, the potential $q^V_{mis}$ becomes lower. Consequently, the cap layer 400 requires a thickness less than certain level.

The potential $q^V_{mis}$ is represented as the following formula (1).

$$q^V_{mis} = (q/\epsilon_o)(\sigma_h - \sigma_c)T_h/\epsilon_h - (q/\epsilon_o)\sigma_c T_s/\epsilon_s \quad (1)$$

Consequently, in order to prevent the field-effect transistor 10 from being operated as the MOS transistor, the following formula (2) is preferably satisfied.

$$V_{mis} - (V_{appli} - V_{th})(T_s + T_h)/(T_f + T_s + T_h) > 0 \quad (2)$$

where, $V_{min}$: threshold voltage when the channel layer 200 under the gate insulating film 510 is operated as an MOS transistor, $V_{appli}$: voltage applied to the gate electrode 520, $V_{th}$: voltage required for forming 2DEG in the channel layer 200 under the gate electrode 520 (Usually, from the viewpoint of convenience for measurement, the threshold value is often determined using gate voltage in which drain current density $I_d = 1$ mA/mm at the time of applying drain voltage $V_d = 10-15$ V in actual GaN-FET. $V_{th}$ may also be determined as threshold voltage of FET of the present invention), $T_s$: a thickness of the cap layer 400, $T_h$: a thickness of the barrier layer 300, and $T_f$: a thickness of the gate insulating film 510.

Figure 4:
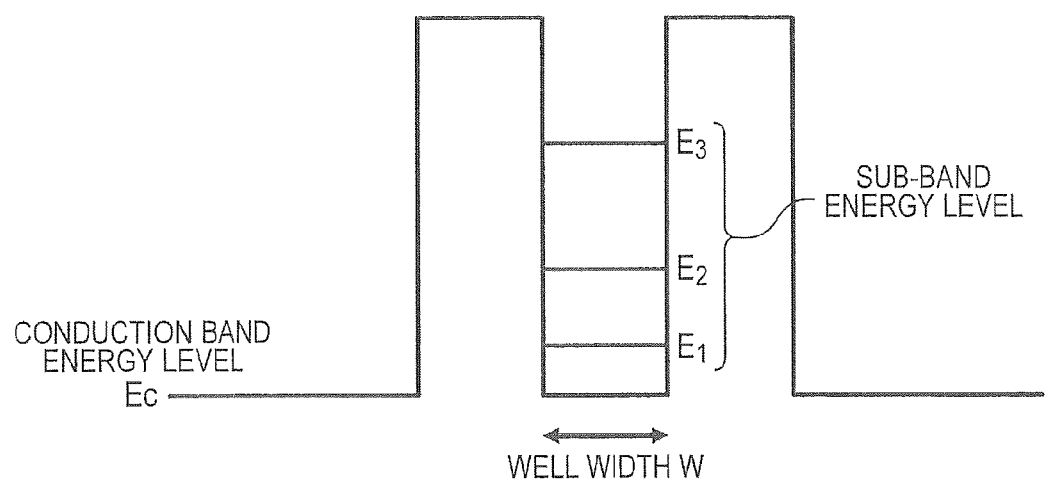
FIG. 4 is a chart illustrating a quantum well model of a well made of a cap layer.
Figure 4:
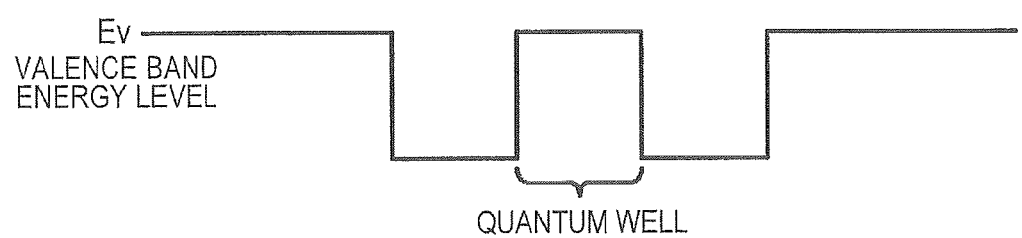
Figure 5:
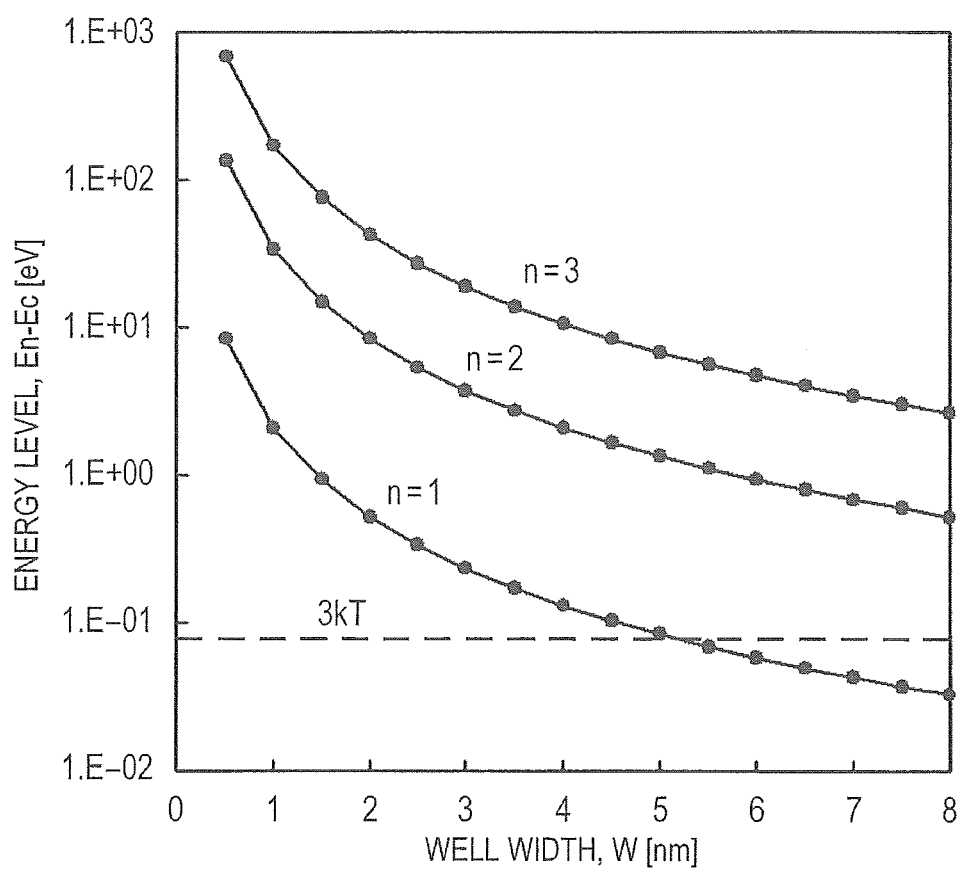
FIG. 5 is a graph illustrating sub-band energy En-Ec to a well width W corresponding to a thickness of the cap layer.

FIG. 4 and FIG. 5 are a chart and a graph illustrating a method in which parallel conduction is suppressed as low as possible, even when the field-effect transistor 10 begins to be operated as the MOS transistor. FIG. 4 illustrates a quantum well model of a well made of a cap layer 400. Here, a height of the potential barrier made of the gate insulating film 510 and the barrier layer 300 is assumed as infinite FIG. 5 illustrates sub-band energy En-Ec to a well width W corresponding to a thickness of the cap layer 400. From FIG. 5, it is found that, as the well width W becomes narrower, the energy level of the sub-band becomes higher and a channel becomes more difficult to be formed. In FIG. 5, the heat energy at room temperature 3 kT is also plotted. From FIG. 5, it is found that the well width W is roughly required to be 5 nm or less, in order not to form a channel by thermal excitation of electrons at a first sub-band (n=1). On the other hand, a thickness of the cap layer 400 is required to be 1.5 nm or more, in order that the cap layer 400 functions as an epitaxial layer. From these results, the thickness of the cap layer 400 is preferably 1.5 nm or more and 5 nm or less.

Figure 6:
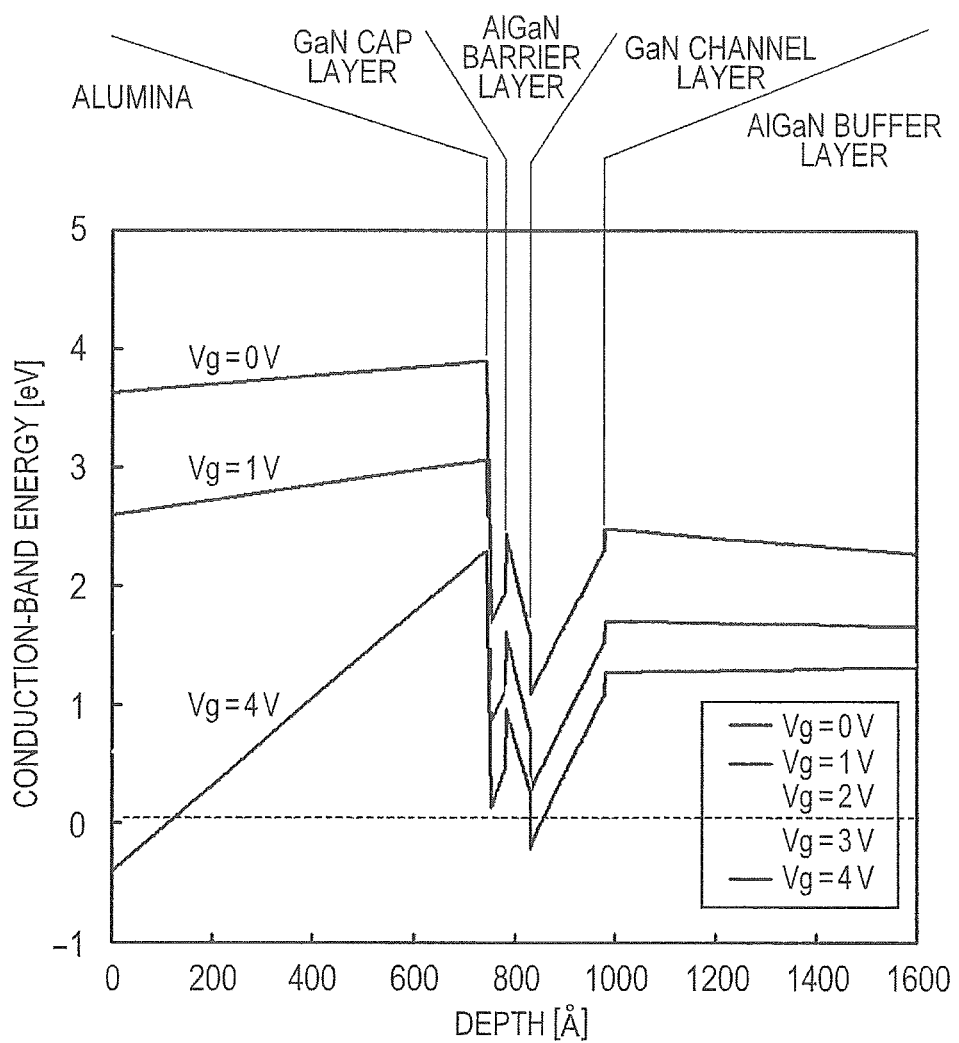
FIG. 6 is a graph illustrating a result of simulation of potential of the conduction band under a gate electrode, when the channel layer is formed as a single layer structure of GaN.

FIG. 6 is illustrates a result of simulation of conduction band potential under the gate electrode 520, when the channel layer 200 is determined as a single layer structure of GaN in the field-effect transistor 10 having the structure illustrated in FIG. 1. In this simulation, the buffer layer 100 is set to an $Al_{0.08}Ga_{0.92}$ layer, and the channel layer 200 is set to a GaN layer having a thickness of 15 nm. In addition, the barrier layer 300 is set to an $Al_{0.23}Ga_{0.77}N$ layer having a thickness of 5 nm and the cap layer 400 is set to a GaN layer having a thickness of 3 nm. The gate insulating film 510 is set to an $Al_2O_3$ layer having a thickness of 75 nm From FIG. 6, it is found that the field-effect transistor 10 is a normally-off type transistor having a threshold value $V_{th} \cong +2$ V. Even when Vg=4 V, the potential at the interface between the gate insulating film 510 and the cap layer 400 is positioned above 0 V. From these results, it is found that an MOS channel of the field-effect transistor 10 does not turn on, even when Vg=4 V. This means that the parallel conduction does not occurred because of no carrier in the MOS channel.

Figure 7:
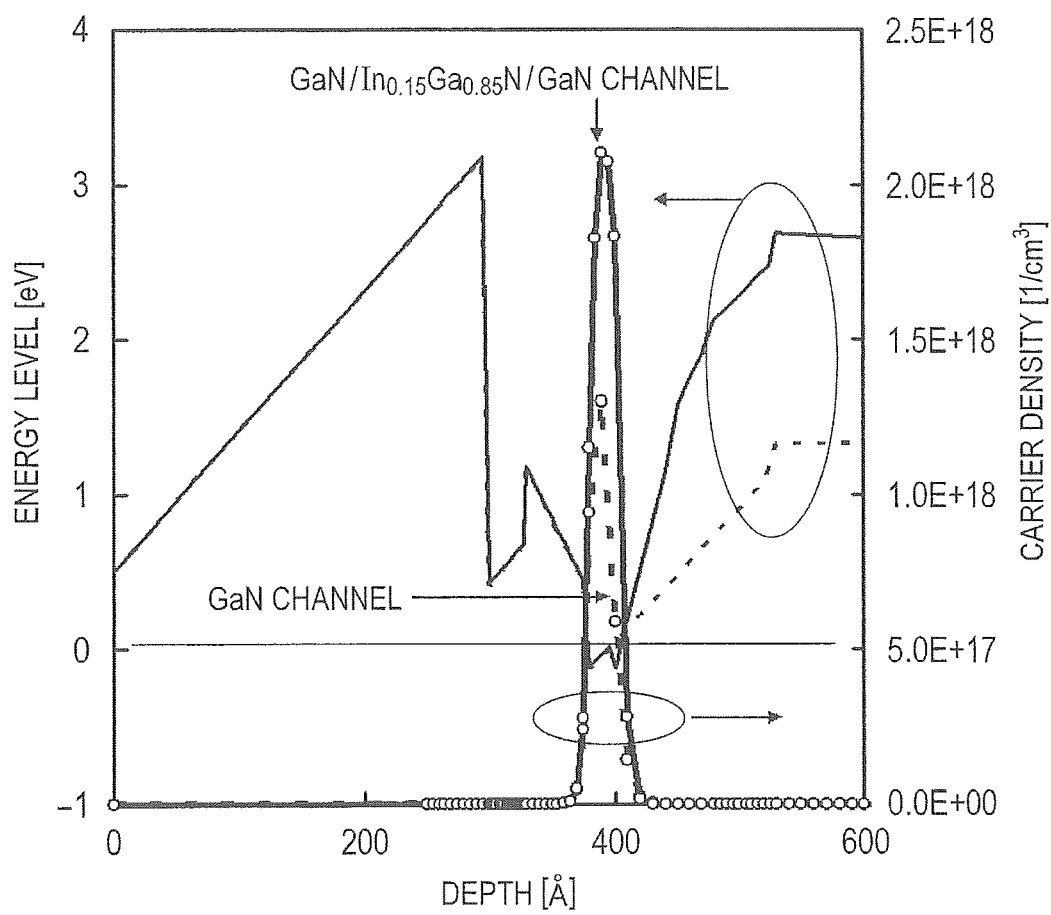
FIG. 7 is a graph illustrating a result of simulation of the potential of the conduction band and carrier density under the gate electrode.

FIG. 7 illustrates a result of simulation of conduction band potential and carrier density under the gate electrode 520 for each of the field-effect transistor 10 having the structure illustrated in FIG. 1 and the field-effect transistor 10 having the structure illustrated in FIG. 6. In this simulation, the channel layer 200 according to this embodiment is set to GaN layer (thickness: 2 nm)/$In_{0.15}Ga_{0.85}N$ layer (thickness: 8 nm)/GaN layer (thickness: 5 nm).

From this graph, it is found that, in the structure according to this embodiment compared with the structure illustrated in FIG. 6, a carrier amount is increased and the center of the channel moves in a direction which recedes from the channel layer 200. When the center of the channel recedes from the channel layer 200, reduction in carrier mobility can be suppressed.

Figure 8A:
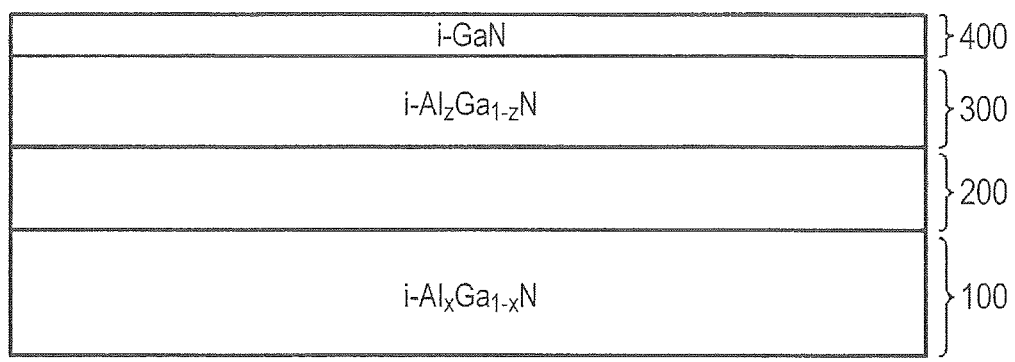
FIGS. 8A and 8B are cross-sectional views illustrating a method for manufacturing the semiconductor device illustrated in FIG. 1.

FIGS. 8A and 8B and FIGS. 9A and 9B are cross-sectional views illustrating a method for manufacturing the semiconductor device illustrated in FIG. 1. First, as illustrated in FIG. 8A, the buffer layer 100, the channel layer 200, the barrier layer 300, and the cap layer 400 are epitaxially grown in this order over a substrate (not illustrated).

Figure 8B:
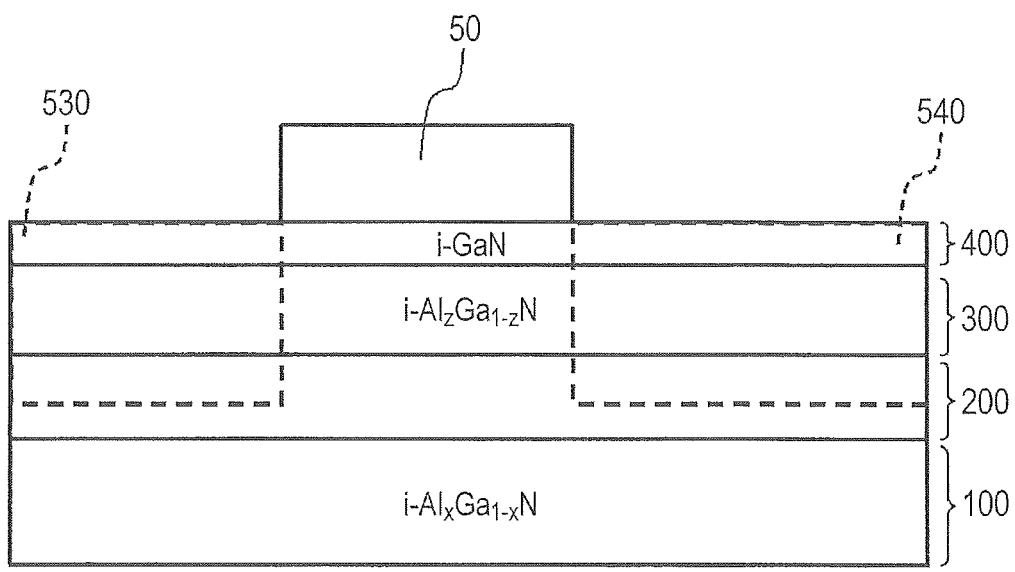

Subsequently, as illustrated in FIG. 8B, a resist pattern 50 is formed over the cap layer 400. The resist pattern 50 covers a region where the gate insulating film 510 is formed in the cap layer 400. Subsequently, an impurity is ion-implanted into the cap layer 400, the barrier layer 300, and the upper part of the channel layer 200 using the resist pattern 50 as a mask. Subsequently, the channel layer 200, the barrier layer 300, and the cap layer 400 are annealed. Thereby, the first impurity layer 530 and the second impurity layer 540 are formed.

Subsequently, element isolation is performed by, for example, forming a groove (not illustrated).

Figure 9A:
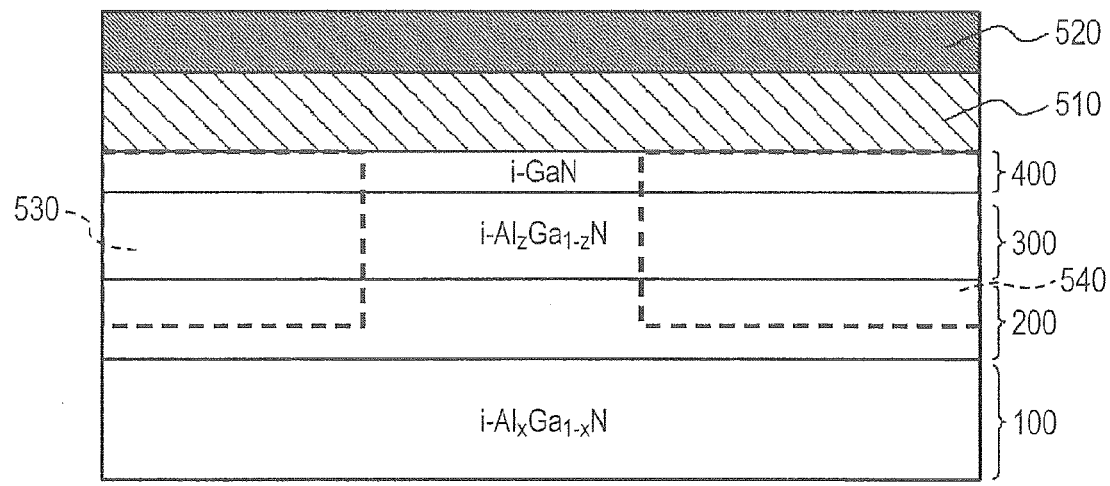
FIGS. 9A and 9B are cross-sectional views illustrating the method for manufacturing the semiconductor device illustrated in FIG. 1.

Subsequently, as illustrated in FIG. 9A, the gate insulating film 510 and the gate electrode 520 are formed in this order over the entire surface of the cap layer 400.

Figure 9B:
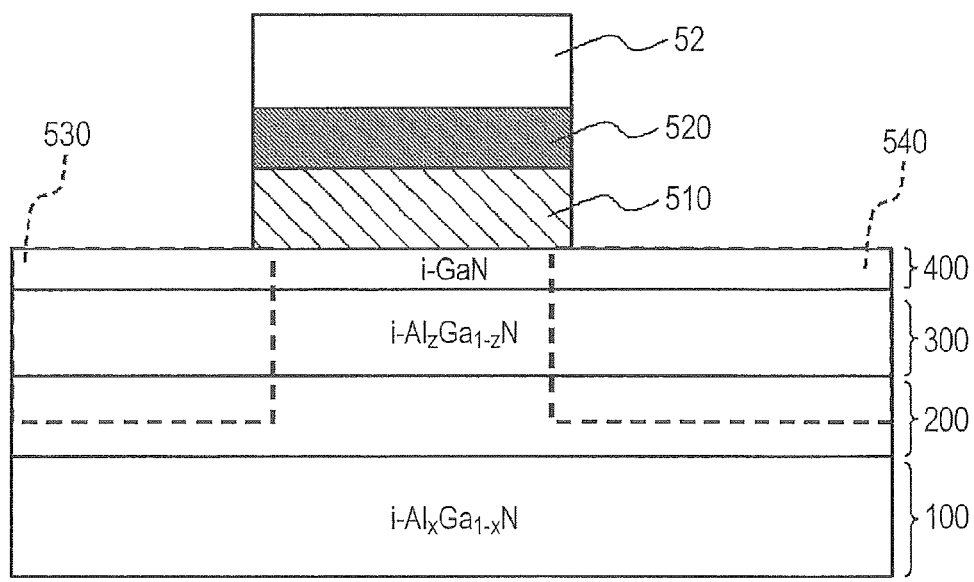

Subsequently, as illustrated in FIG. 9B, a resist pattern 52 is formed over the gate electrode 520. Subsequently, the gate electrode 520 and the gate insulating film 510 are partially removed using the resist pattern 52 as a mask. Thereby, the gate electrode 520 and the gate insulating film 510 are removed from over the first impurity layer 530 and the second impurity layer 540.

Thereafter, a source electrode 532 and a drain electrode 542 are formed over the cap layer 400. Subsequently, the protective insulating film 600 is formed. From these processes, the field-effect transistor 10 illustrated in FIG. 1 is formed.

Subsequently, operation and effect of this embodiment are described. According to this embodiment, the compression strains are generated at the interface of the cap layer 400 and the barrier layer 300 and the interface of the channel layer 200 and the buffer layer 100. Consequently, the negative charge is higher than the positive charge at these interfaces. The tensile strain is generated at the interface between the barrier layer 300 and the channel layer 200. Consequently, positive charge is higher than negative charge at this interface. Therefore, electric field is generated in a direction from the gate insulating film 510 to the buffer layer 100 caused by polarization. Thereby, the threshold voltage of the field-effect transistor 10 is increased.

On the other hand, negative charge is higher than positive charge at the interface between the buffer layer 100 and the channel layer 200. Consequently, electrons forming the channel are pushed to the barrier layer 300 side. This state is described using a band chart of conduction band of FIG. 6. In the band chart of the conduction band of FIG. 6, near an interface between a GaN channel layer and an AlGaN buffer layer, potential of the conduction band is increased because negative space charge is increased. Consequently, the conduction band in the GaN channel layer is pulled upward at the interface between the GaN channel layer and the AlGaN buffer layer, and gradient of the conduction band (electric field) becomes large. As a result, electrons in the GaN channel layer is gathered in the AlGaN barrier layer by the electric field. If the electrons exist near the interface between the GaN channel layer and the AlGaN barrier layer, electron mobility is decreased because the electrons are easy to be subjected to the scatter at the interface. As a result, the on-resistance of the field-effect transistor 10 is raised. On the other hand, the channel layer 200 has a stacked layer structure of the first layer 202, the second layer 204 and the third layer 206 in this embodiment. The second layer 204 has the higher electron affinity than those of the first layer 202 and the third layer 206. Consequently, electrons in the channel are accumulated in the second layer 204 having the high electron affinity. As a result, the electrons in the channel near the interface between the AlGaN barrier layer and the GaN channel layer can be reduced. In other words, pushing the electrons forming the channel to the barrier layer 300 side can be suppressed. Therefore, the on-resistance of the field-effect transistor 10 can be reduced.

In the modification of the first embodiment, the gate insulating film 510 may be formed by p-type GaN or p-type AlGaN. This gate insulating film 510 enables to increase the threshold voltage.

Second Embodiment

FIG. 10 is a cross-sectional view illustrating a configuration of the field-effect transistor 10 according to the second embodiment. The field-effect transistor 10 according to this embodiment has a similar configuration to the field-effect transistor 10 according to the first embodiment except the following points.

First, the cap layer 400 is formed only in a region positioned under the gate insulating film 510 and is removed from other region. The source electrode 532 and the drain electrode 542 are formed over the barrier layer 300.

Figure 11A:
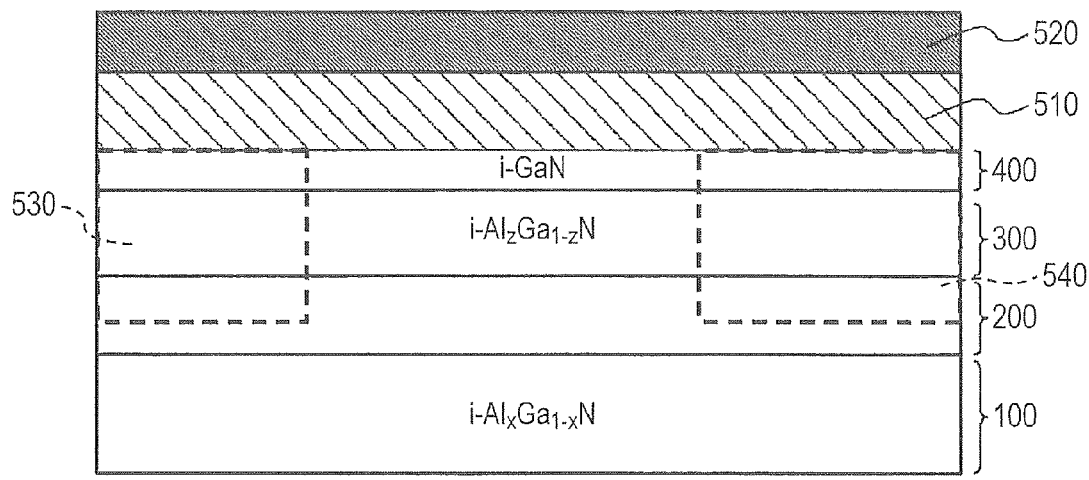
FIGS. 11A and 11B are cross-sectional views illustrating the method for manufacturing the semiconductor device illustrated in FIG. 10.
Figure 11B:
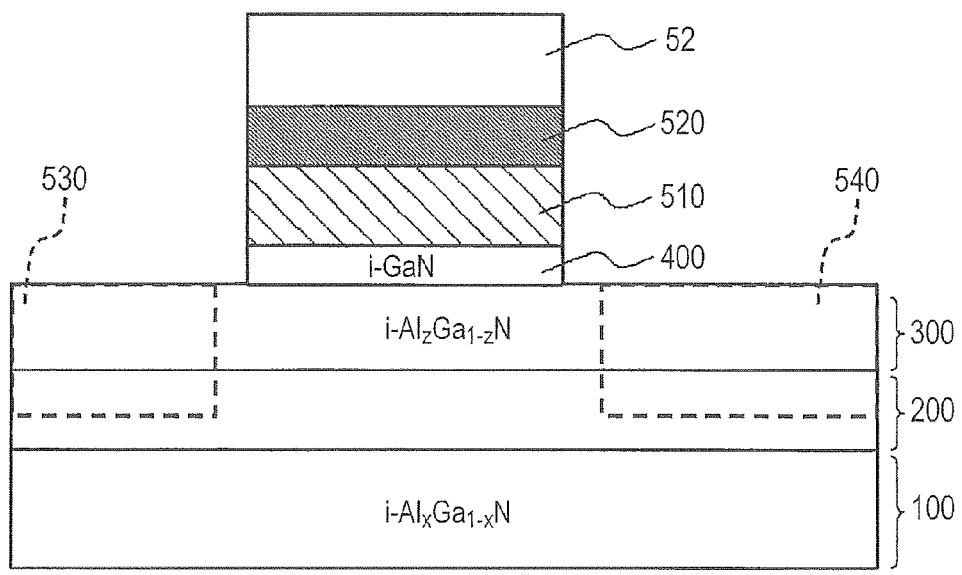

FIGS. 11A and 11B are cross-sectional views illustrating the method for manufacturing the semiconductor device illustrated in FIG. 10. First, as illustrated in FIG. 11A, the buffer layer 100, the channel layer 200, the barrier layer 300, the cap layer 400, the first impurity layer 530, and the second impurity layer 540 are formed. Further, the gate insulating film 510 and the gate electrode 520 are formed over the entire surface of the cap layer 400. These methods for forming are similar to the methods of the first embodiment.

Subsequently, as illustrated in FIG. 11B, the resist pattern 52 is formed over the gate electrode 520. Subsequently, the gate electrode 520, the gate insulating film 510, and the cap layer 400 are etched in this order using the resist pattern 52 as a mask.

Thereafter, the source electrode 532 and the drain electrode 542, and the protective insulating film 600 are formed.

A similar effect to the first embodiment can be obtained by this embodiment. The field-effect transistor 10 is in a normally-on state in the region except under the cap layer 400. Therefore, the on-resistance of the field-effect transistor 10 is low. The source electrode 532 and the drain electrode 542 are easy to be coupled in an ohmic manner.

Third Embodiment

Figure 12:
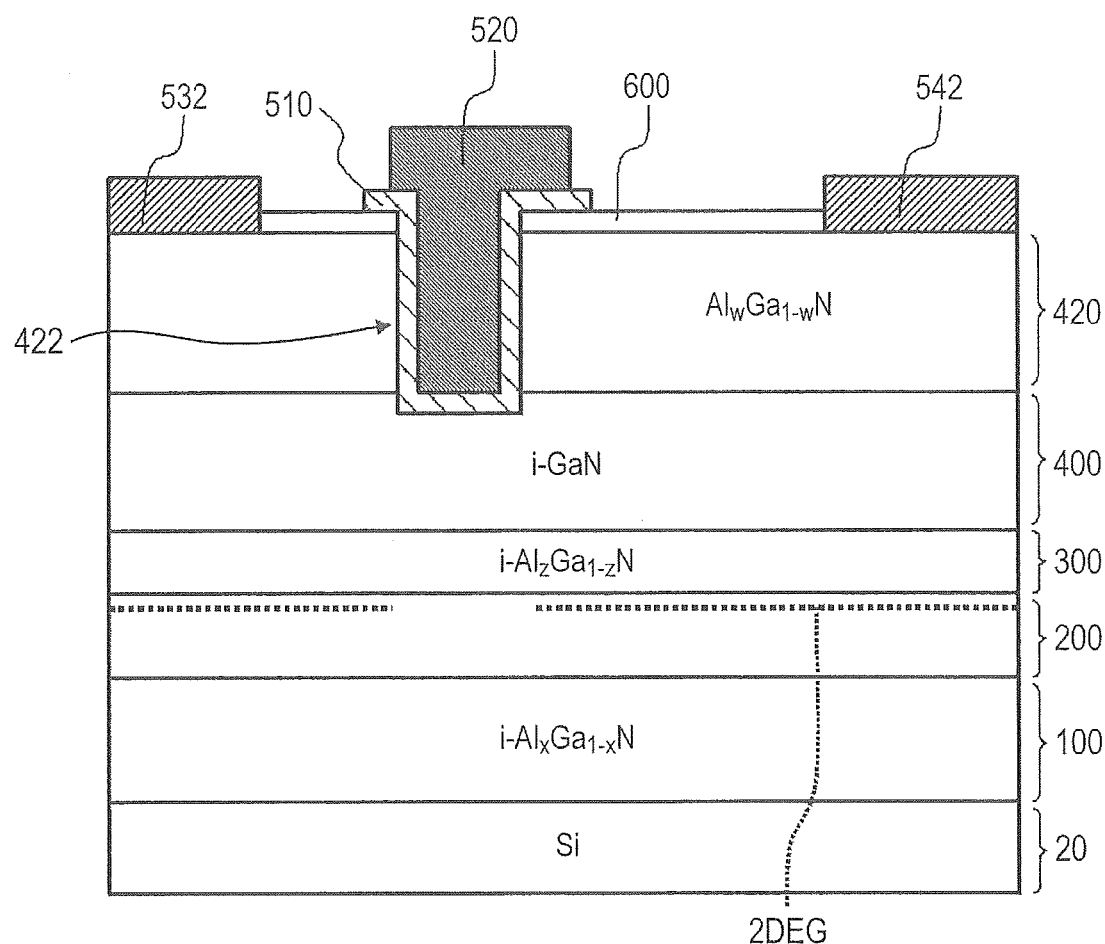
FIG. 12 is a cross-sectional view illustrating a configuration of a field-effect transistor according to a third embodiment.

FIG. 12 is a cross-sectional view illustrating a configuration of the field-effect transistor 10 according to the third embodiment. The field-effect transistor 10 according to this embodiment has a similar configuration to the field-effect transistor 10 according to the first embodiment except the following points.

First, an electron supply layer 420 is formed over the cap layer 400. The electron supply layer 420 is a nitride semiconductor layer, for example, an $Al_wGa_{1-w}N$ layer. The source electrode 532 and the drain electrode 542 are formed over the electron supply layer 420.

A concave part 422 is formed in the electron supply layer 420. The bottom part of the concave part 422 reaches to the cap layer 400. In the example illustrated in this view, the bottom part of the concave part 422 intrudes into the cap layer 400.

Figure 13:
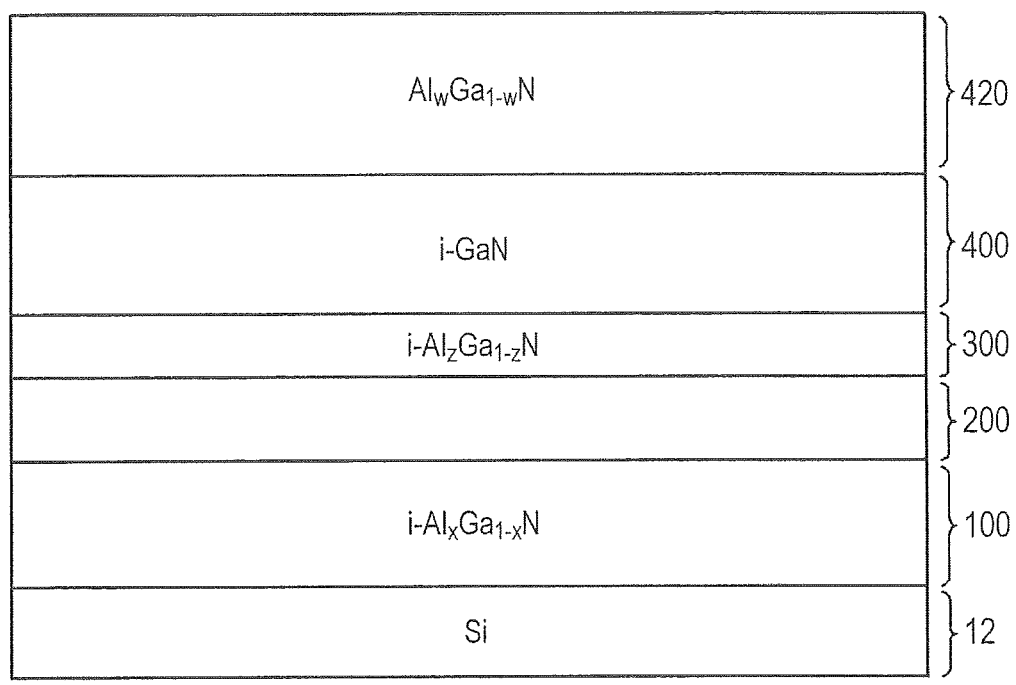
FIG. 13 is a cross-sectional view illustrating the method for manufacturing the semiconductor device illustrated in FIG. 12.
Figure 14:
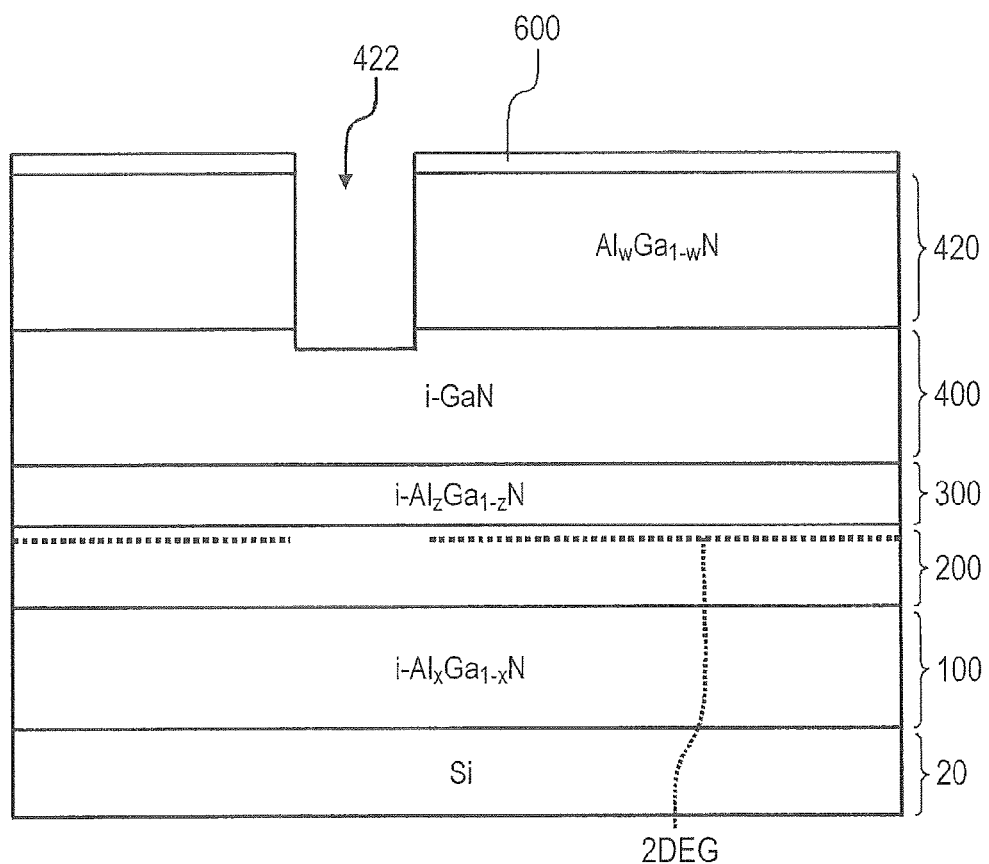
FIG. 14 is a cross-sectional view illustrating the method for manufacturing the semiconductor device illustrated in FIG. 12.
Figure 15:
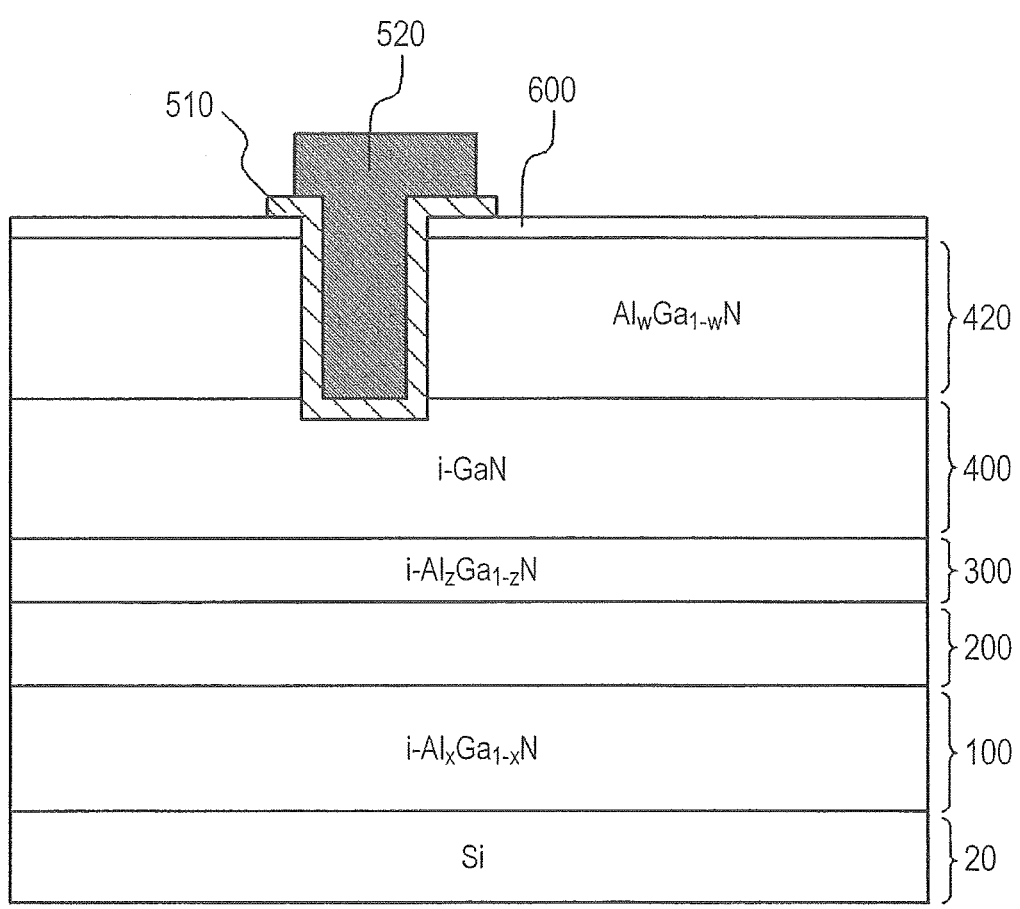
FIG. 15 is a cross-sectional view illustrating the method for manufacturing the semiconductor device illustrated in FIG. 12.

The gate insulating film 510 is formed on the side surface and the bottom surface of the concave part 422 and over a part positioned around the concave part 422 in the electron supply layer 420. The gate electrode 520 is formed in the concave part 422 and over the gate insulating film 510 positioned around the concave part 422. FIG. 13 to FIG. 15 are cross-sectional views illustrating a method for manufacturing the semiconductor device illustrated in FIG. 12. First, as illustrated in FIG. 13, the buffer layer 100, the channel layer 200, the barrier layer 300, the cap layer 400, and the electron supply layer 420 are epitaxially grown in this order over the substrate 20.

Subsequently, as illustrated in FIG. 14, the protective insulating film 600 is formed. Subsequently, a part positioned in a region where the concave part 422 should be formed in the protective insulating film 600 is removed. Subsequently, the electron supply layer 420 and the upper part of the cap layer 400 are etched using the protective insulating film 600 as a mask. Thereby, the concave part 422 is formed.

Subsequently, as illustrated in FIG. 15, the gate insulating film 510 and the gate electrode 520 are formed.

Thereafter, a part positioned in a region where the source electrode 532 and the drain electrode 542 should be formed in the protective insulating film 600 is removed. Subsequently, the source electrode 532 and the drain electrode 542 are formed.

A similar effect to the first embodiment can be obtained by this embodiment. The field-effect transistor 10 is in a normally-on state in the region except under the concave part 422. Therefore, the on-resistance of the field-effect transistor 10 is reduced.

Fourth Embodiment

Figure 16:
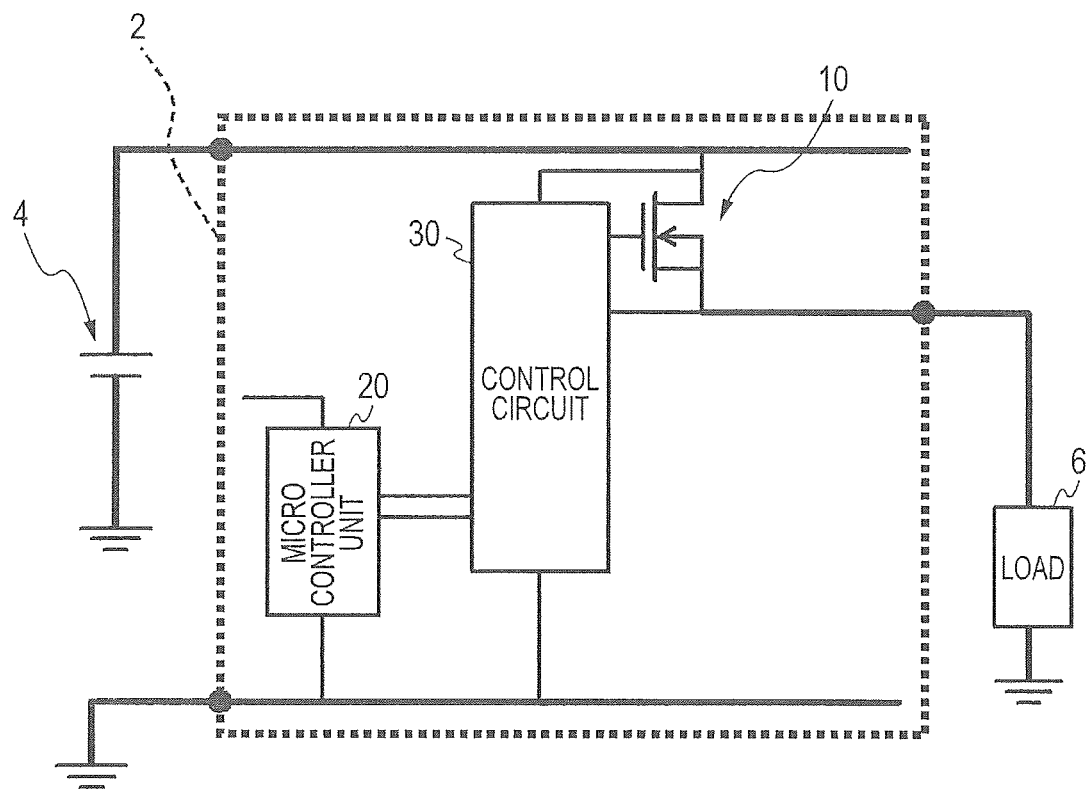
FIG. 16 is a chart illustrating a circuit configuration of an electronic device according to a fourth embodiment.

FIG. 16 is a chart illustrating a circuit configuration of an electronic device 2 according to the fourth embodiment. The electronic device 2 has the semiconductor device (that is, the field-effect transistor 10) described in any one of the first to third embodiments. The electronic device is used for, for example, vehicles and has the electronic device 2, an electric power supply 4, and a load 6. The electric power supply 4 is, for example, a battery mounted in a vehicle. The load 6 is an electronic part mounted in a vehicle such as a head lump, a power source for an automatic window, a motor for a power source of the vehicle. The electronic device 2 controls electric power supplying from the electric power supply 4 to the load 6.

The electronic device 2 is a device mounting a semiconductor device having the field-effect transistor 10, a semiconductor device 20, and a semiconductor device having a control circuit 30 over a circuit substrate (for example, a printed circuit board). The semiconductor device 20 has a microcontroller unit and coupled to the field-effect transistor 10 through a wire of the circuit substrate. The semiconductor device 20 controls the field-effect transistor 10. In detail, the semiconductor device 20 inputs control signals to the control circuit 30. The control circuit 30 inputs signals to the gate electrode 520 of the field-effect transistor 10 in accordance with the control signals inputted from the semiconductor device 20. In other words, the control circuit 30 controls the field-effect transistor 10. Electric power is adequately supplied from the electric power supply 4 to the load 6 by controlling the field-effect transistor 10.

In each of the embodiments described above, an InAlN-based material or an InGaN-based material may be used as long as the buffer layer 100, the channel layer 200, the barrier layer 300, and the cap layer 400 satisfy every factor of the strain and the polarization.

The embodiments of the present invention are described above with reference to the drawings. However, these embodiments are only exemplification of the present invention, and various configurations except the above-described configuration can be employed.

The present invention may be summarized as following supplementary notes.

(1) A method for manufacturing a semiconductor device comprising:
  forming a buffer layer made of a nitride semiconductor;
  forming a channel layer made of a nitride semiconductor over the buffer layer;
  forming a barrier layer made of a nitride semiconductor over the channel layer;
  forming a cap layer made of a nitride semiconductor over the barrier layer;
  forming a gate insulating film so as to in contact with the cap layer; and
  forming a gate electrode over the gate insulating film,
  wherein compression strains are generated at an interface between the cap layer and the barrier layer and an interface between the channel layer and the buffer layer and a tensile strain is generated at an interface between the barrier layer and the channel layer by controlling compositions of the cap layer, the barrier layer, the channel layer, and the buffer layer;
  wherein the channel layer has a stacked layer structure of a first layer, a second layer, and a third layer; and
  wherein the second layer has a higher electron affinity than those of the first layer and the third layer by controlling compositions of the first layer, the second layer, and the third layer.

(2) A method for manufacturing a semiconductor device comprising:
  forming a buffer layer made of a nitride semiconductor;
  forming a channel layer made of a nitride semiconductor over the buffer layer;
  forming a barrier layer made of a nitride semiconductor over the channel layer;
  a cap layer made of a nitride semiconductor formed the barrier layer;
  forming a gate insulating film so as to in contact with the cap layer; and
  forming a gate electrode over the gate insulating film,
  wherein the cap layer, the barrier layer, the channel layer, and the buffer layer are polarized;
  wherein negative charge is higher than positive charge at an interface between the cap layer and the barrier layer and an interface between the channel layer and the buffer layer and positive charge is higher than negative charge at an interface between the barrier layer and the channel layer by controlling compositions of the cap layer, the barrier layer, the channel layer, and the buffer layer;
  wherein the channel layer has a stacked layer structure of a first layer, a second layer, and a third layer; and
  wherein the second layer has a higher electron affinity than those of the first layer and the third layer by controlling compositions of the first layer, the second layer, and the third layer.

(3) A method for manufacturing a semiconductor device comprising:
  forming a buffer layer made of $Al_xGa_{1-x}N$;
  forming a channel layer having a stacked layer structure stacking a GaN layer, an $In_yGa_{1-y}N$ layer, and a GaN layer in this order over the buffer layer (here, x<y);
  forming a barrier layer made of $Al_zGa_{1-z}N$ over the channel layer (here, x<z);
  forming a cap layer made of GaN over the barrier layer;
  forming a gate insulating film so as to be in contact with the cap layer; and
  forming a gate electrode over the gate insulating film.

What is claimed is:

1. A method for manufacturing a semiconductor device comprising:
  forming a buffer layer made of a nitride semiconductor;
  forming a channel layer made of a nitride semiconductor over the buffer layer;
  forming a barrier layer made of a nitride semiconductor over the channel layer;
  forming a cap layer made of a nitride semiconductor over the barrier layer;
  forming a gate insulating film so as to be in contact with the cap layer; and
  forming a gate electrode over the gate insulating film,
  wherein compression strains are generated at an interface between the cap layer and the barrier layer and an interface between the channel layer and the buffer layer and a tensile strain is generated at an interface between the barrier layer and the channel layer by controlling compositions of the cap layer, the barrier layer, the channel layer, and the buffer layer;
  wherein the channel layer has a stacked layer structure of a first layer, a second layer, and a third layer; and
  wherein the second layer has a higher electron affinity than those of the first layer and the third layer by controlling compositions of the first layer, the second layer, and the third layer.

2. A method for manufacturing a semiconductor device comprising:
  forming a buffer layer made of a nitride semiconductor;
  forming a channel layer made of a nitride semiconductor over the buffer layer;
  forming a barrier layer made of a nitride semiconductor over the channel layer;
  a cap layer made of a nitride semiconductor formed the barrier layer;
  forming a gate insulating film so as to be in contact with the cap layer; and
  forming a gate electrode over the gate insulating film,
  wherein the cap layer, the barrier layer, the channel layer, and the buffer layer are polarized;
  wherein negative charge is higher than positive charge at an interface between the cap layer and the barrier layer and an interface between the channel layer and the buffer layer and positive charge is higher than negative charge at an interface between the barrier layer and the channel layer by controlling compositions of the cap layer, the barrier layer, the channel layer, and the buffer layer;

wherein the channel layer has a stacked layer structure of a first layer, a second layer, and a third layer; and wherein the second layer has a higher electron affinity than those of the first layer and the third layer by controlling compositions of the first layer, the second layer, and the third layer.

3. A method for manufacturing a semiconductor device comprising:

forming a buffer layer made of $Al_xGa_{1-x}N$;

forming a channel layer having a stacked layer structure stacking a GaN layer, an $In_yGa_{1-y}N$ layer, and a GaN layer in this order over the buffer layer (here, x<y);

forming a barrier layer made of $Al_zGa_{1-z}N$ over the channel layer (here, x<z);

forming a cap layer made of GaN over the barrier layer;

forming a gate insulating film so as to be in contact with the cap layer; and forming a gate electrode over the gate insulating film.

* * * * *